(12) United States Patent
Sekine

(10) Patent No.: US 8,801,304 B2
(45) Date of Patent: Aug. 12, 2014

(54) CAMERA MODULE AND METHOD FOR MANUFACTURING CAMERA MODULE

(75) Inventor: Hirokazu Sekine, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 86 days.

(21) Appl. No.: 13/417,424

(22) Filed: Mar. 12, 2012

(65) Prior Publication Data

US 2012/0294602 A1 Nov. 22, 2012

(30) Foreign Application Priority Data

May 19, 2011 (JP) .................................. 2011-112290

(51) Int. Cl.
*G03B 17/38* (2006.01)
*H01L 27/146* (2006.01)

(52) U.S. Cl.
CPC .............. *H01L 27/14618* (2013.01)
USPC ....................................................... 396/502

(58) Field of Classification Search
CPC ................ H01L 27/14614; H04N 5/2257
USPC ........................................................ 396/502
See application file for complete search history.

(56) References Cited

U.S. PATENT DOCUMENTS

| | | | | |
|---|---|---|---|---|
| 7,925,154 B2* | 4/2011 | Ryu | ............................. | 396/268 |
| 7,997,812 B2* | 8/2011 | Kim | ............................. | 396/529 |
| 2006/0239671 A1* | 10/2006 | Shiraishi et al. | ................ | 396/89 |
| 2007/0069105 A1* | 3/2007 | Lin | ............................ | 250/201.2 |
| 2009/0051774 A1* | 2/2009 | Shiraishi | .................. | 348/207.99 |
| 2009/0075514 A1* | 3/2009 | Saitoh et al. | .................. | 439/374 |
| 2009/0244728 A1* | 10/2009 | Tamoyama et al. | .......... | 359/819 |
| 2009/0284631 A1* | 11/2009 | Matsuo et al. | ................ | 348/294 |
| 2010/0142066 A1* | 6/2010 | Okabe et al. | .................. | 359/824 |

FOREIGN PATENT DOCUMENTS

JP 2010-49181 3/2010

OTHER PUBLICATIONS

U.S. Appl. No. 13/234,471, filed Sep. 16, 2011, Atsuko Kawasaki, et al.

* cited by examiner

*Primary Examiner* — Clayton E Laballe
*Assistant Examiner* — Linda B Smith
(74) *Attorney, Agent, or Firm* — Oblon, Spivak, McClelland, Maier & Neustadt, L.L.P.

(57) ABSTRACT

Certain embodiments provide a camera module including a lens holder that holds a lens, a transparent substrate disposed below the lens in the lens holder, a driving-device, a substrate including a sensor unit, a driver IC, a plurality of external electrodes electrically connected to the sensor unit and the driver IC, and a wiring for the driving-device. The driving-device is a device which moves the lens in the vertical direction and which is disposed above the transparent substrate in the lens holder. The substrate is disposed below the transparent substrate in the lens holder. The driver IC is an IC which drives the driving-device and which is disposed at a rear side of the substrate. The wiring for the driving-device electrically connects the driving-device with the driver IC.

18 Claims, 7 Drawing Sheets

CAMERA MODULE AND METHOD FOR MANUFACTURING CAMERA MODULE

CROSS REFERENCE TO RELATED APPLICATIONS

This application is based upon and claims the benefit of priority from the prior Japanese Patent Application No.2011-112290 filed in Japan on May 19, 2011; the entire contents of which are incorporated herein by reference.

FIELD

Embodiments described herein relate generally to a camera module and a method for manufacturing the camera module.

BACKGROUND

Generally, the size of a camera module having an auto-focus (hereinafter referred to as AF: Auto Focus) function increases because a driving-device for moving a lens in a vertical direction is mounted in the camera module. A camera module described below is known as a conventional camera module which has an AF function and the size of which can be reduced.

The conventional camera module includes a sensor substrate in which a sensor is disposed on a rear surface of a glass substrate, a lens holder holding a lens and a driving-device that drives the lens inside the lens holder, and an external electrode formed on a rear surface of the sensor substrate to electrically connect the sensor substrate with wiring substrate. In the camera module, the lens holder is mounted on the wiring substrate while the driving-device is disposed on the glass substrate.

A driver IC for supplying a drive voltage to the driving-device is mounted on the wiring substrate outside the lens holder. The driver IC and the driving-device are electrically connected with each other via wiring on the wiring substrate, the external electrode, and a penetrating electrode that penetrates the glass substrate.

However, it is difficult to form the penetrating electrode in the glass substrate on which the sensor is formed.

When manufacturing the conventional camera module having an AF function, a position of the lens holder needs to be adjusted so that light entered through the lens forms an image on the sensor while the lens is shifted to either an upper position or the lower position. However, the lens holder is mounted on the wiring substrate, so that the position of the lens cannot be adjusted by moving the lens holder in a vertical direction. Therefore, it is necessary to separately provide a position adjustment mechanism that can move the position of the lens, that is, the position of the lens holder, to the lens holder.

DETAILED DESCRIPTION

Certain embodiments provide a camera module including a lens holder, a transparent substrate, a driving-device, a substrate, a driver IC for the driving-device, a plurality of external electrodes, and a wiring for the driving-device. The lens holder has a cylindrical shape and includes a lens inside thereof. The transparent substrate is disposed below the lens in the lens holder. The driving-device is a device that moves the lens in the vertical direction and is disposed above the transparent substrate in the lens holder. The substrate is a substrate having a sensor unit on a front surface thereof and wiring connected to the sensor unit via a penetrating electrode on a rear surface thereof, and is disposed below the transparent substrate in the lens holder. The driver IC for the driving-device is an IC that drives the driving-device and is disposed at a rear side of the substrate. The plurality of external electrodes are formed on the rear surface of the substrate and are electrically connected to the wiring and the driver IC for the driving-device, respectively. The wiring for the driving-device is electrically connects the driving-device with the driver IC for the driving-device.

Certain embodiments provide a camera module manufacturing method including forming an adhesive, disposing a lens holder, adjusting a position of the lens holder, curing the adhesive, and electrically connecting a driving-device with a driver IC for a driving-device. The adhesive is formed on a front surface of a transparent substrate of a solid-state image pickup device including a substrate which includes a sensor unit on a front surface thereof and the driver IC for the driving-device disposed at a rear side thereof and the transparent substrate disposed above the substrate. The lens holder has a cylindrical shape and includes a lens and the driving-device that moves the lens in a vertical direction. Further, a fixing plate and a wiring for the driving-device that electrically connects the driving-device and the driver IC for the driving-device with each other are formed on an inner surface of the lens holder. The lens holder is disposed so that the fixing plate is in contact with the adhesive. A position of the lens holder is adjusted by pressing the fixing plate into the adhesive so that a focal point of the lens corresponds to the sensor unit of the solid-state image pickup device. The adhesive is cured after the position of the lens holder is adjusted. The driving-device and the driver IC for the driving-device are electrically connected with each other via the wiring for the driving-device.

Hereinafter, a camera module and a method for manufacturing the camera module according to an embodiment will be described. The camera modules described below are small-sized camera modules with a chip size (CSCM: Chip Scale Camera Module) having an auto-focus function.

(First Embodiment)

Figure 1:
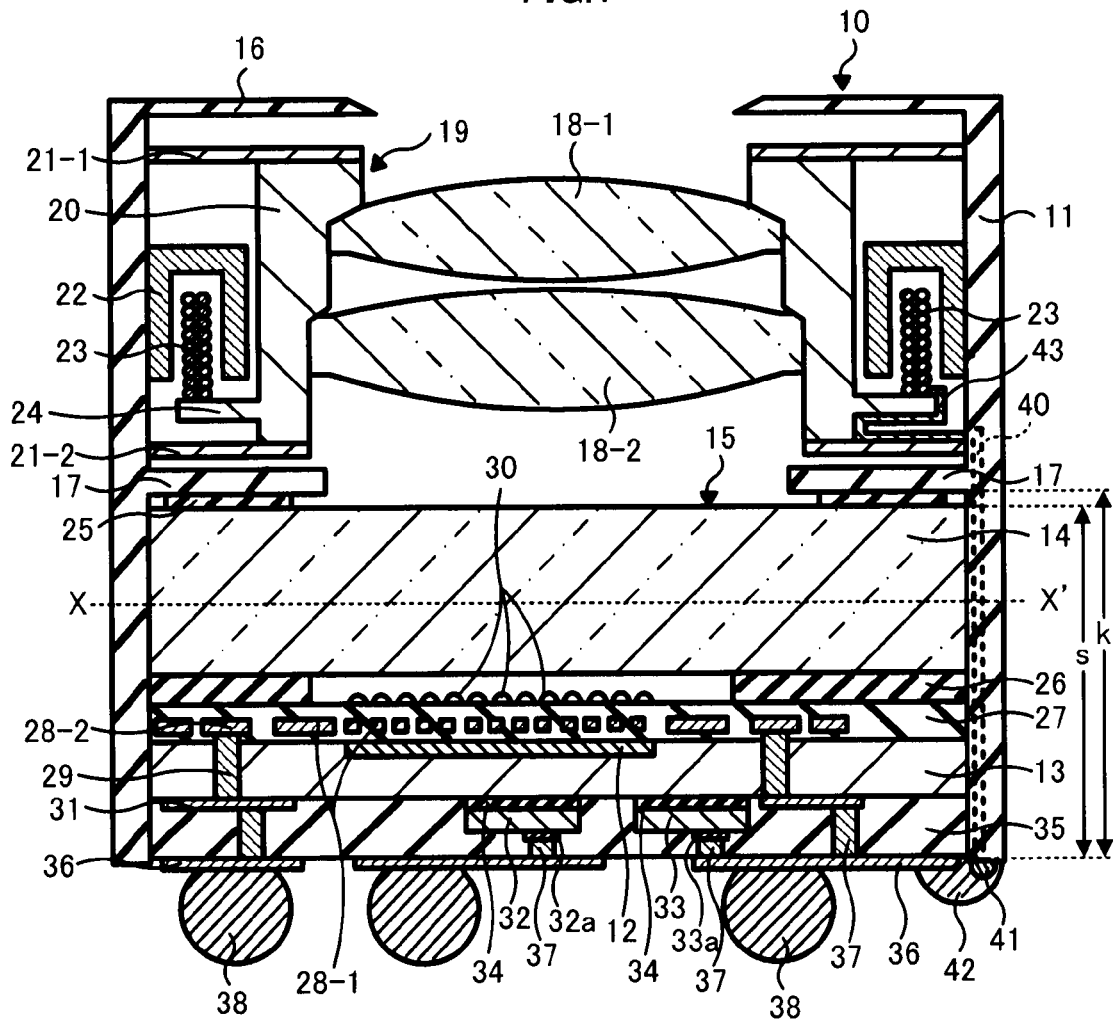
FIG. 1 is a cross-sectional view showing a camera module according to a first embodiment.

FIG. 1 is a vertical cross-sectional view showing a camera module according to a first embodiment. As shown in FIG. 1, a camera module 10 includes a cylindrical lens holder 11 and a solid-state image pickup device 15 disposed in the lens holder 11. The solid-state image pickup device 15 includes a silicon substrate 13 having a sensor unit 12 and a transparent substrate 14 and is disposed in the lens holder 11 so that a circumferential surface of the solid-state image pickup device 15 is in contact with an inner surface of the lens holder 11.

A top plate 16 in which an opening portion is formed is formed at an opening end (upper end portion) of the cylindrical lens holder 11. A fixing plate 17 for fixing the lens holder 11 to the solid-state image pickup device 15 is provided on the inner surface of the lens holder 11.

The cylindrical lens holder 11 has a plurality of lenses (a first lens 18-1 and a second lens 18-2) and a driving-device 19 inside thereof.

The driving-device 19 moves the first lens 18-1 and the second lens 18-2 in a vertical direction. The driving-device 19 is disposed above the transparent substrate 14 and between the fixing plate 17 and the top plate 16 in the lens holder 11. The driving-device 19 includes a lens barrel 20, an upper leaf spring 21-1, a lower leaf spring 21-2, a yoke (magnet) 22, and a coil 23.

The lens barrel 20 has a cylindrical shape and holds the first lens 18-1 and the second lens 18-2 inside thereof. These lenses 18-1 and 18-2 are pressed into the lens barrel 20, so that the lenses 18-1 and 18-2 are held by the lens barrel 20. The lens barrel 20 has a support plate 24 for supporting the coil 23 on an outer surface thereof.

The upper leaf spring 21-1 and the lower leaf spring 21-2 are elastic plate bodies and are fixed to the inner surface of the lens holder 11 as well as to both opening end portions of the lens barrel 20, respectively. In other words, the lens barrel 20 is fixed inside the lens holder 11 by the upper leaf spring 21-1 and the lower leaf spring 21-2.

The yoke 22 has a ring shape along the inner surface of the lens holder 11 and is fixed to the inner surface of the lens holder 11 between the upper leaf spring 21-1 and the lower leaf spring 21-2. A cross-sectional shape of the yoke 22 is a squared U-shape having a lower open end. The yoke 22 generates a magnetic field inside thereof.

The coil 23 has a ring shape corresponding to the shape of the yoke 22 and is fixed to the support plate 24 of the lens barrel 20. The coil 23 is inserted inside the squared U-shaped yoke 22.

A current flowing through the coil 23 is a current flowing in the magnetic field generated inside the yoke 22. Therefore, when a current is flown through the coil 23, a Lorentz force proportional to an amount of the current flowing through the coil 23 is generated in the coil 23 along an optical axis direction (in a vertical direction in FIG. 1). The coil 23 is fixed to the lens barrel 20, so that the lens barrel 20 tries to move along the optical axis direction (the vertical direction in FIG. 1) by the Lorentz force. On the other hand, the lens barrel 20 receives reaction forces from the upper leaf spring 21-1 and the lower leaf spring 21-2. Therefore, the lens barrel 20 stays at a position at which the Lorentz force balances the reaction forces received from the upper leaf spring 21-1 and the lower leaf spring 21-2 in the lens holder 11.

In other words, the driving-device 19 moves the lens barrel 20, that is, the first and the second lenses 18-1 and 18-2, to a predetermined position according to the amount of the current flowing through the coil 23. Thereby, the AF function is realized.

The lens holder 11 described above is fixed to the transparent substrate 14 (solid-state image pickup device 15) by an adhesive 25 between a front surface of the transparent substrate 14 (front surface of the solid-state image pickup device 15) and the fixing plate 17. The fixing plate 17 is disposed on the transparent substrate 14. More specifically, the fixing plate 17 is disposed at a position at which a distance k between a lower end surface of the lens holder 11 and the fixing plate 17 is slightly longer than a thickness s of the solid-state image pickup device 15 (except for external electrodes described later).

As described later, the adhesive 25 between the solid-state image pickup device 15 and the fixing plate 17 is a position adjustment adhesive 25 that functions as a position adjustment mechanism for adjusting the position of the lens holder 11 with respect to the solid-state image pickup device 15. In other words, a thickness of the adhesive 25 is adjusted, so that the lens holder 11 is fixed to a predetermined position with respect to the solid-state image pickup device 15.

In the solid-state image pickup device 15 disposed in the lens holder 11, the transparent substrate 14 is a support substrate for thinning the silicon substrate 13 and, for example, is formed of a glass substrate. A circumferential surface of the transparent substrate 14 is in contact with the inner surface of the lens holder 11.

The silicon substrate 13 is a substrate supported by the transparent substrate 14 to be thinned and has a sensor unit 12 on a front surface thereof. The sensor unit 12 is formed of, for example, a built-in photodiode layer, and generates charges according to received light.

The silicon substrate 13 is fixed to a rear surface of the transparent substrate 14 via an adhesive 26. The adhesive 26 is a space forming adhesive 26 that functions as a spacer forming a desired space between the silicon substrate 13 and the transparent substrate 14.

A first insulting film 27 is formed on a front surface of the silicon substrate 13. The first insulting film 27 includes first wiring 28-1 and a first pad electrode 28-2 inside thereof. A first penetrating electrode 29 is formed in the silicon substrate 13, and the first pad electrode 28-2 is in contact with the first penetrating electrode 29.

A plurality of microlenses 30 are formed on a front surface of the first insulating film 27 in an area above the sensor unit 12. These microlenses 30 collect light incident on the camera module 10 to the sensor unit 12.

The space forming adhesive 26 is formed into a ring shape on the surface of the first insulating film 27 so that the space forming adhesive 26 encloses the plurality of microlenses 30.

On a rear surface of the silicon substrate 13, second wiring 31 is formed and an electronic component chip 32 and a driver IC 33 are disposed.

The second wiring 31 is in contact with the first penetrating electrode 29. The electronic component chip 32 and the driver IC 33 are respectively fixed to the rear surface of the silicon substrate 13 by a die attach film 34.

The electronic component chip 32 is, for example, a semiconductor chip such as an image processing IC and a logic IC or a passive component such as a capacitor chip. On an upper surface of the electronic component chip 32 (on a lower surface of the chip in FIG. 1), a pad electrode 32a for the chip is provided.

The driver IC 33 is an IC for driving the driving-device 19 disposed on the transparent substrate 14. Specifically, the driver IC 33 is an IC for flowing a current through the coil 23 included in the driving-device 19. The driver IC 33 includes a pad electrode 33a for the IC on an upper surface thereof (on a lower surface of the IC in FIG. 1). Although the driver IC 33 and the coil 23 are electrically connected with each other, a wiring structure for the electrical connection will be described later.

An insulating film layer 35, which is a second insulating film 35, is attached to the rear surface of the silicon substrate 13 including the second wiring 31, the electronic component chip 32, and the driver IC 33. A front surface of the insulating film layer 35 (a lower surface of the film in FIG. 1) is substantially flat. The insulating film layer 35 is formed by heat treatment so that the insulating film layer 35 fills unevenness on the rear surface of the silicon substrate 13, which is formed by the second wiring 31, the electronic component chip 32, and the driver IC 33. A front surface of the insulating film layer 35 can be formed to be substantially flat by appropriately setting conditions of heat treatment to form the insulating film layer 35.

Third wiring 36 is formed on the front surface of the insulting film layer 35. Second penetrating electrodes 37, which are in contact with the second wiring 31, the pad electrode 32a for the chip, and the pad electrode 33a for the IC, are formed in the insulating film layer 35 by a method such as patterning. The third wiring 36 is in contact with the second penetrating electrodes 37.

External electrodes 38 are formed on the third wiring 36. The external electrodes 38 electrically connect the camera module 10 to wiring on a mounting substrate (not shown in FIG. 1) when the camera module 10 is mounted on the mounting substrate (not shown in FIG. 1). For example, the external electrodes 38 are formed of solder balls.

The front surface of the insulating film layer 35 including the third wiring 36 is covered with solder resist (not shown in FIG. 1) except for areas of the external electrodes 38.

Figure 2:
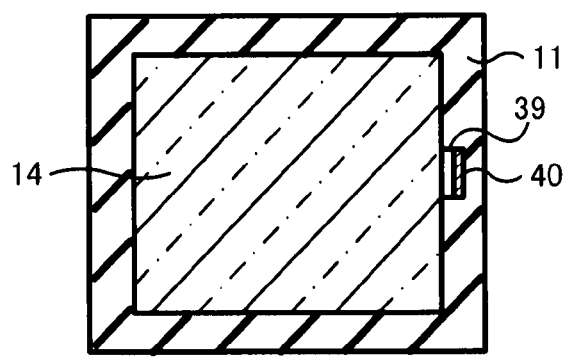
FIG. 2 is a plan view of a cross section of a camera module 10 cut along a dotted line X-X' in FIG. 1 as viewed from the above.

Next, the wiring structure for electrically connecting the driver IC 33 with the coil 23 of the driving-device 19 will be described with reference to FIG. 2. FIG. 2 is a plan view of a cross section of a camera module 10 cut along a dotted line X-X' in FIG. 1 as viewed from the above.

As shown in FIG. 2, a first groove portion 39 having a concave shape is formed on the inner surface of the lens holder 11. The first groove portion 39 is formed to penetrate from a position where the lower leaf spring 21-2 is disposed to the lower end surface of the lens holder 11. Driving-device wiring 40 is formed in the first groove portion 39 (FIG. 1).

For example, as shown in FIG. 1, connection wiring 43 is formed from a front surface of the lower leaf spring 21-2 to be connected to the coil 23 via an outer surface of the lens barrel 20 including the support plate 24. One end of the driving-device wiring 40 is connected to the coil 23 via the connection wiring 43.

As shown in FIG. 1, the other end of the driving-device wiring 40 is exposed from the lower end surface of the lens holder 11. The other end of the driving-device wiring 40 is connected to a driving-device electrode 41 provided on the lower end surface of the lens holder 11. The driving-device electrode 41 is connected to the third wiring 36 provided on a rear surface of the solid-state image pickup device 15 by a connection conductor 42. For example, the connection conductor 42 is formed of silver paste.

In this way, the driving-device wiring 40 electrically connects the coil 23 of the driving-device 19 disposed above the transparent substrate 14 with the driver IC 33 disposed below the transparent substrate 14.

The first groove portion 39 in which the driving-device wiring 40 is formed can be easily manufactured by forming a convex portion in a predetermined position of a metal mold for forming the lens holder 11. The wiring 40 in the first groove portion 39 is integrally formed with the lens holder 11 by pouring a material such as a resin into the metal mold in a state in which a wiring metal is formed on the convex portion of the metal mold when the lens holder is formed using the metal mold. The connection wiring 43 on the front surface of the lower leaf spring 21-2 and the outer surface of the lens barrel 20 including the support plate 24 can be also formed in the same manner.

Next, as a method for manufacturing the camera module 10 described above, a method for fixing the lens holder 11 to the solid-state image pickup device 15 will be described with reference to FIGS. 3 to 6. FIGS. 3 to 6 are diagrams for explaining the method for manufacturing the camera module 10 and are cross-sectional views corresponding to FIG. 1. FIGS. 3 to 6 omit a part of the solid-state image pickup device 15 or a part of a test solid-state image pickup device 15'.

Figure 3:
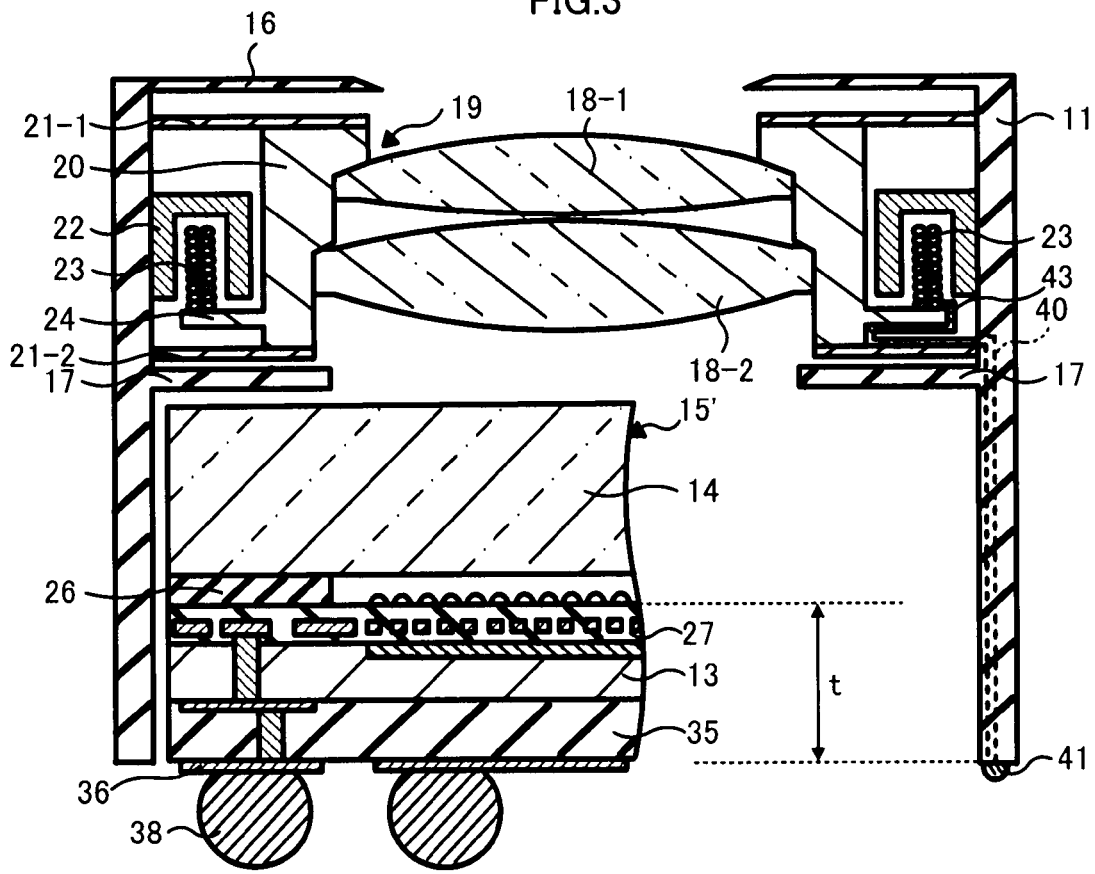
FIG. 3 is a diagram showing a method for manufacturing the camera module according to the first embodiment and is a cross-sectional view corresponding to FIG. 1.

First, as shown in FIG. 3, a focus position of the lens holder 11 is measured by using the test solid-state image pickup device 15'. Although the test solid-state image pickup device 15' may be a solid-state image pickup device having the same structure as that of the solid-state image pickup device 15 described above, the test solid-state image pickup device 15' only has to have an image pickup function and have the same thickness as that of the solid-state image pickup device 15 excluding the external electrodes 38, so that the test solid-state image pickup device 15' is not necessarily required to have the electronic component chip 32 and the driver IC 33. In the description below, "the solid-state image pickup device 15" means the solid-state image pickup device 15 shown in FIG. 1.

When measuring the focus position, a test image to be captured (not shown in the drawings) is actually captured by using the test solid-state image pickup device 15' and the lens holder 11, and a position of the lens holder 11 when the test image is in focus is measured. A position t of the lens holder 11 is a distance from a reference surface, which is a front surface of a first insulating film 27 of the test solid-state image pickup device 15', to the lower end surface of the lens holder 11.

Figure 4:
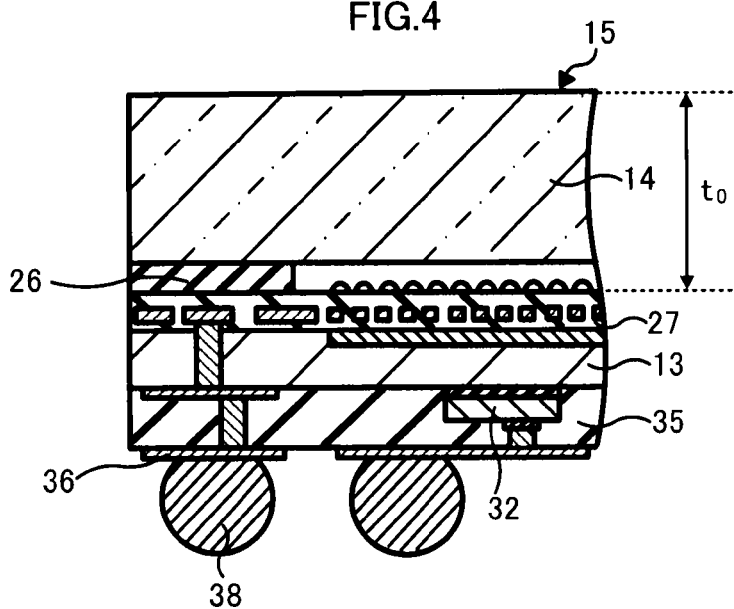
FIG. 4 is a diagram showing the method for manufacturing the camera module according to the first embodiment and is a cross-sectional view showing a solid-state image pickup device.

On the other hand, as shown in FIG. 4, a distance $t_0$ from the front surface of the first insulating film 27 of the solid-state image pickup device 15 to the front surface of the transparent substrate 14 is measured.

Figure 5:
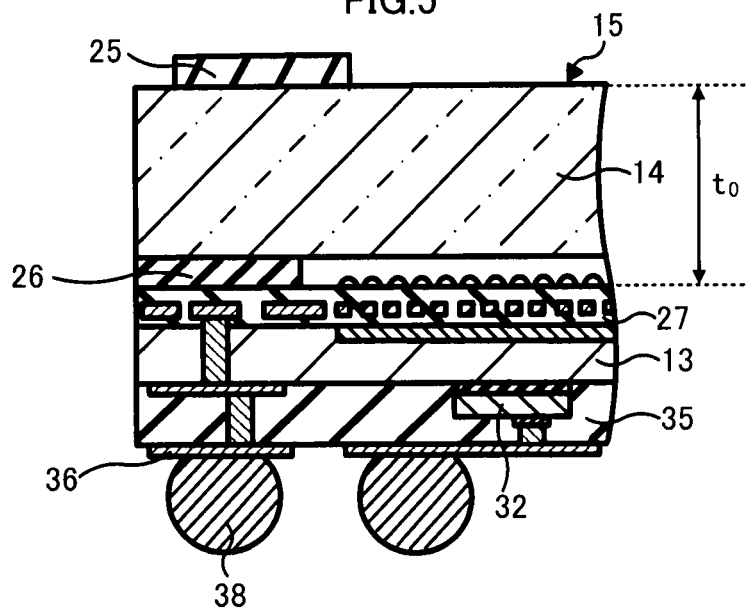
FIG. 5 is also a diagram showing the method for manufacturing the camera module according to the first embodiment and is a cross-sectional view showing the solid-state image pickup device.

Next, as shown in FIG. 5, the adhesive 25 is formed into a ring shape on the front surface of the solid-state image pickup device 15 (on the front surface of the transparent substrate 14).

Figure 6:
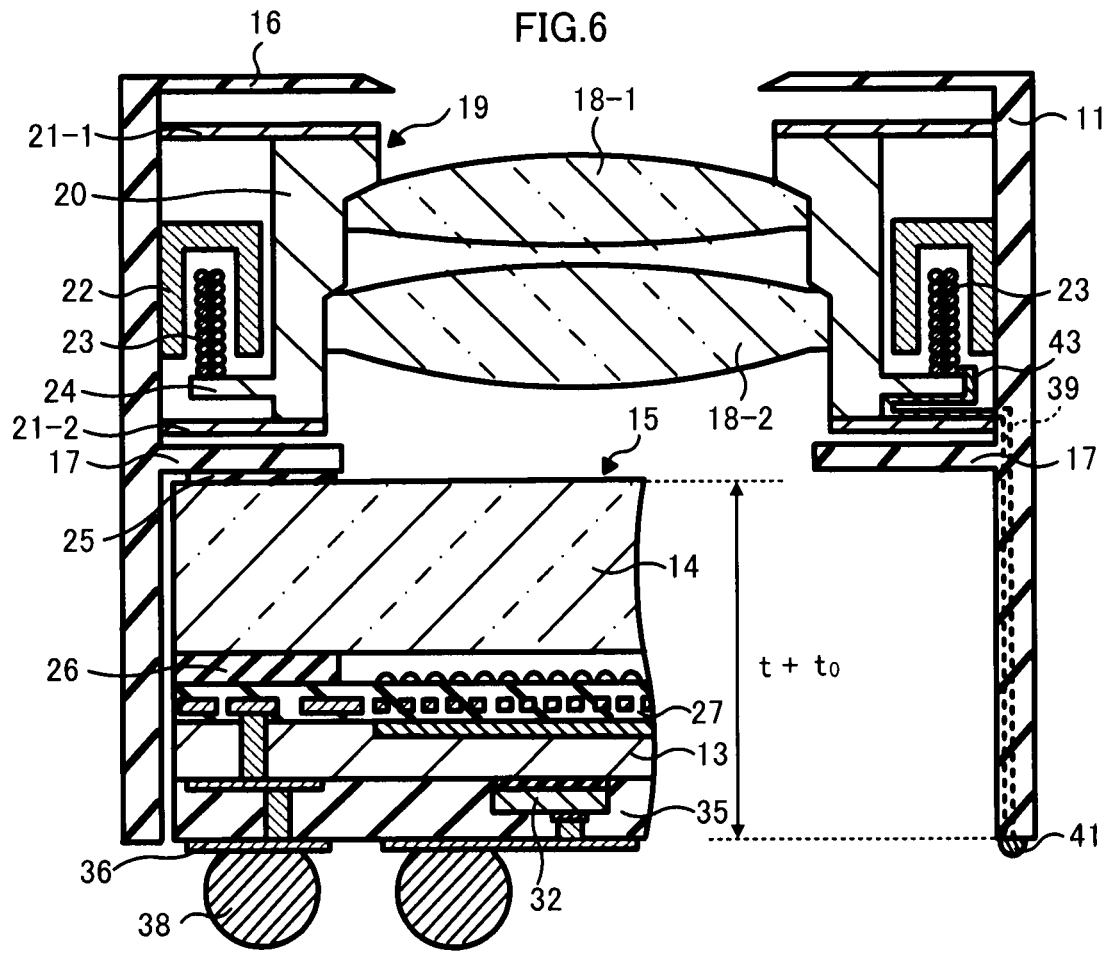
FIG. 6 is a diagram showing the method for manufacturing the camera module according to the first embodiment and is a cross-sectional view corresponding to FIG. 1.

Next, as shown in FIG. 6, the fixing plate 17 of the lens holder 11 is pressed into the adhesive 25 so that a distance from the front surface of the solid-state image pickup device 15 (the front surface of the transparent substrate 14) to the lower end surface of the lens holder 11 is $t+t_0$. The adhesive 25 is cured after the lens holder 11 is disposed at the desired position. Thereby, the lens holder 11 is fixed onto the front surface of the solid-state image pickup device 15 (the front surface of the transparent substrate 14) via the adhesive 25.

Finally, the driving-device electrode 41 of the lens holder 11 and the third wiring 36 on the rear surface of the solid-state image pickup device 15 are electrically connected to each other by the connection conductor 42 such as, for example, silver paste. Thereby, the driver IC 33 and the coil 23 of the driving-device 19 are electrically connected to each other and the camera module 10 shown in FIG. 1 is manufactured.

According to the camera module 10 of the present embodiment described above, the driver IC 33 disposed below the transparent substrate 14 and the coil 23 of the driving-device 19 disposed above the transparent substrate are electrically connected to each other by the driving-device wiring 40 provided in the first groove portion 39 of the lens holder 11. Therefore, it is possible to connect the coil 23 and the driver IC 33 to each other without forming a penetrating electrode in the transparent substrate 14, so that it is possible to provide the camera module 10 which has an AF function and which can be easily manufactured.

According to the camera module 10 of the present embodiment, when fixing the lens holder 11 to the solid-state image pickup device 15, the lens holder 11 is fixed to a desired position by providing the position adjustment adhesive 25 on the front surface of the solid-state image pickup device 15 and adjusting an amount by which the fixing plate 17 of the lens holder 11 is pressed into the position adjustment adhesive 25. In this way, according to the camera module 10 of the present embodiment, it is not necessary to provide a position adjustment mechanism that can adjust the mounting positions of the first and the second lenses 18-1 and 18-2 in the lens holder 11, so that it is possible to provide the inexpensive camera module 10 which has an AF function and which can be easily manufactured.

According to the camera module 10 of the present embodiment, the driving-device 19 is disposed above the solid-state image pickup device 15 and the driver IC 33 for driving the driving-device 19 is disposed on the rear surface of the silicon substrate 13 included in the solid-state image pickup device 15. Therefore, it is possible to provide the small-sized camera module 10 having an AF function.

(Second Embodiment)

Figure 7:
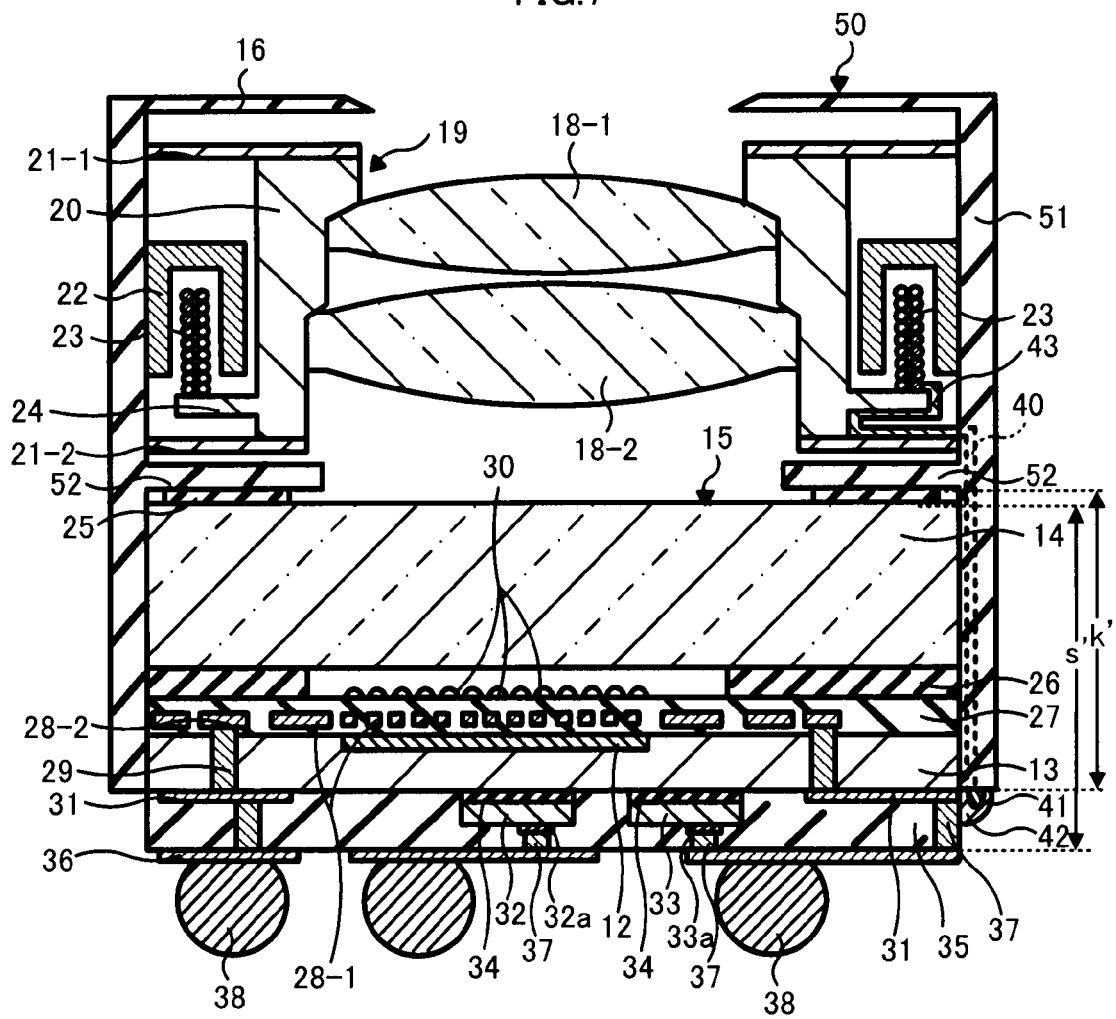
FIG. 7 is a cross-sectional view showing a camera module according to a second embodiment.

FIG. 7 is a vertical cross-sectional view showing a camera module 50 according to a second embodiment. In the camera module 50 shown in FIG. 7, a connection position between the driving-device electrode 41 and the solid-state image pickup device 15 is different from that in the camera module 10 of the first embodiment.

Specifically, in the camera module 50 of the second embodiment, the driving-device electrode 41 is electrically connected to the second wiring 31 of the solid-state image pickup device 15 by the connection conductor 42 such as, for example, silver paste.

In this case, the fixing plate 52 of the lens holder 51 may be formed at a position at which a distance k' between the lower end surface of the lens holder 51 and the fixing plate 52 is appropriately shorter than a thickness s' of the solid-state image pickup device 15 excluding the external electrodes 38.

A manufacturing method of the camera module 50 is the same as that of the camera module 10 of the first embodiment, so that the description thereof will not be repeated here.

Also in the camera module 50 of the second embodiment described above, it is possible to connect the coil 23 and the driver IC 33 to each other without forming a penetrating electrode in the transparent substrate 14, so that it is possible to provide the camera module 50 which has an AF function and which can be easily manufactured.

Also in the camera module 50 of the second embodiment, it is not necessary to form a position adjustment mechanism that can adjust the mounting positions of the first and the second lenses 18-1 and 18-2 in the lens holder 51, so that it is possible to provide the camera module 50 which has an AF function and which can be easily manufactured. Further, it is not necessary to form a position adjustment mechanism, so that it is possible to provide the inexpensive camera module 50 having an AF function.

Also in the camera module 50 of the second embodiment, the driving-device 19 is disposed above the solid-state image pickup device 15 and the driver IC 33 for driving the driving-device 19 is disposed on the rear surface of the silicon substrate 13 included in the solid-state image pickup device 15. Therefore, it is possible to provide the small-sized camera module 50 having an AF function.

(Third Embodiment)

Figure 8:
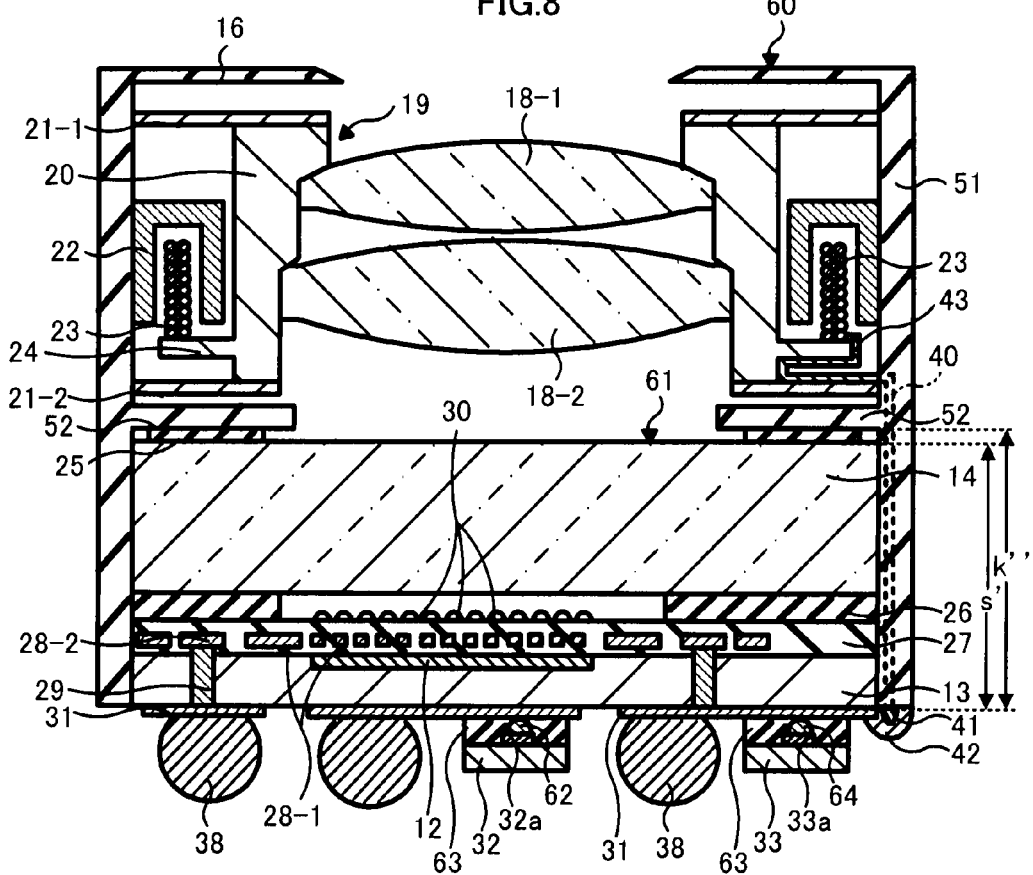
FIG. 8 is a cross-sectional view showing a camera module according to a third embodiment.

FIG. 8 is a vertical cross-sectional view showing a camera module 60 according to a third embodiment. In the camera module 60 shown in FIG. 8, a structure of a rear surface of a silicon substrate 13 included in a solid-state image pickup device 61 is different from that in the camera module 50 of the second embodiment.

As shown in FIG. 8, in the camera module 60 of the third embodiment, the second wiring 31 is formed on the rear surface of the silicon substrate 13. The second wiring 31 is in contact with the first penetrating electrode 29 that penetrates the silicon substrate 13.

The electronic component chip 32, the driver IC 33, and the external electrodes 38 are respectively formed on the second wiring 31.

The electronic component chip 32 has a pad electrode 32a for the chip on an upper surface thereof. A bump 62 for the chip is formed on the pad electrode 32a for the chip. The bump 62 is in contact with the second wiring 31. An anisotropic conductive paste 63 is formed between the electronic component chip 32 and the second wiring 31. The electronic component chip 32 is electrically connected to the second wiring 31 via the bump 62 and metal particles in the anisotropic conductive paste 63.

Similarly, the driver IC 33 also has a pad electrode 33a for the IC on an upper surface thereof. A bump 64 for the IC is formed on the pad electrode 33a for the IC. The bump 64 is in contact with the second wiring 31. An anisotropic conductive paste 63 is formed between the driver IC 33 and the second wiring 31. The driver IC 33 is electrically connected to the second wiring 31 via the bump 64 and metal particles in the anisotropic conductive paste 63.

The rear surface of the silicon substrate 13 including the electronic component chip 32, the driver IC 33, and the second wiring 31 is covered with solder resist (not shown in FIG. 8) except for areas of the external electrodes 38.

In this case, the fixing plate 52 of the lens holder 51 is disposed at a position at which a distance k" between the lower end surface of the lens holder 51 and the fixing plate 52 is slightly longer than a thickness s' of the solid-state image pickup device 15 excluding the external electrodes 38.

A manufacturing method of the camera module 60 is the same as that of the camera module 10 of the first embodiment, so that the description thereof will not be repeated here.

Also in the camera module 60 of the third embodiment described above, it is possible to connect the coil 23 and the driver IC 33 to each other without forming a penetrating electrode in the transparent substrate 14, so that it is possible to provide the camera module 60 which has an AF function and which can be easily manufactured.

Also in the camera module 60 of the third embodiment, it is not necessary to form a position adjustment mechanism that can adjust the mounting positions of the first and the second lenses 18-1 and 18-2 in the lens holder 51, so that it is possible to provide the camera module 60 which has an AF function and which can be easily manufactured. Further, it is not necessary to form a position adjustment mechanism, so that it is possible to provide the inexpensive camera module 60 having an AF function.

Also in the camera module 60 of the third embodiment, the driving-device 19 is disposed above the solid-state image pickup device 61 and the driver IC 33 for driving the driving-device 19 is disposed on the rear surface of the silicon substrate 13 included in the solid-state image pickup device 61.

Therefore, it is possible to provide the small-sized camera module 60 having an AF function.

(Fourth Embodiment)

Figure 9:
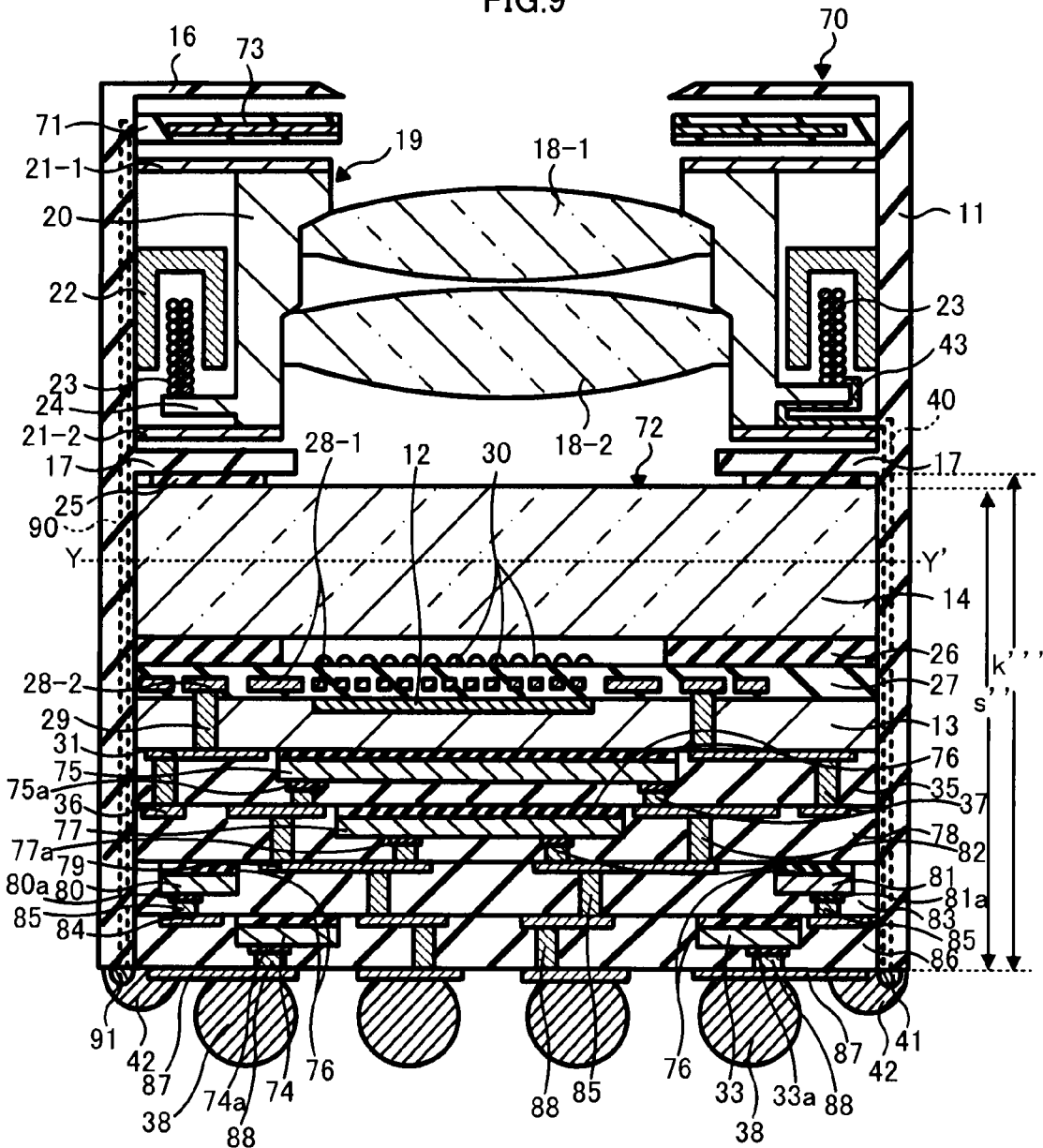
FIG. 9 is a cross-sectional view showing a camera module according to a fourth embodiment.
Figure 10:
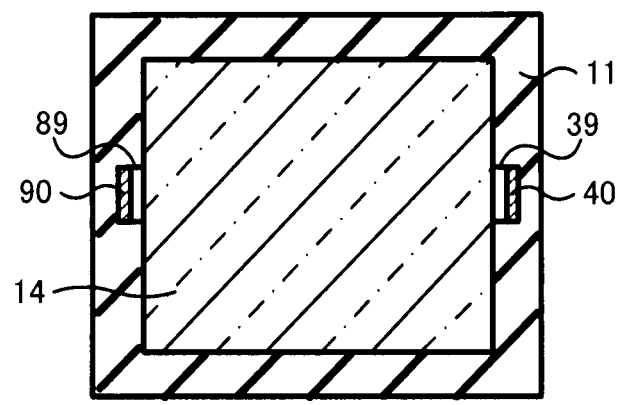
FIG. 10 is a plan view of a cross section of a camera module 70 cut along a dotted line Y-Y' in FIG. 9 as viewed from the above.

FIG. 9 is a vertical cross-sectional view showing a camera module 70 according to a fourth embodiment. FIG. 10 is a plan view of a cross section of a camera module 70 cut along a dotted line Y-Y' in FIG. 9 as viewed from the above.

The camera module 70 shown in FIGS. 9 and 10 is different from the camera module 10 of the first embodiment in a point in which the camera module 70 has a shutter unit 71 in the lens holder 11. Further, in the camera module 70 shown in FIGS. 9 and 10, a structure of a rear surface of a silicon substrate 13 included in a solid-state image pickup device 72 is different from that in the camera module 10 of the first embodiment.

As shown in FIG. 9, in the camera module 70 of the fourth embodiment, the lens holder 11 has the shutter unit 71 inside thereof. The shutter unit 71 is disposed above the transparent substrate 14 and between the top plate 16 and the upper leaf spring 21-1 and is fixed to the inner surface of the lens holder 11.

The shutter unit 71 has a shutter blade 73. The shutter blade 73 is driven to open and close by a driver IC 74 described later in an area below the opening portion provided in the top plate 16. When the shutter blade 73 is closed, the shutter blade 73 blocks incident light to the opening portion of the top plate 16. When the shutter blade 73 is opened, the incident light to the opening portion of the top plate 16 is not blocked by the shutter blade 73 and received inside the camera module 70.

On the rear surface of the silicon substrate 13, the second wiring 31 is formed and a semiconductor memory 75 for recording images is disposed. The semiconductor memory 75 is, for example, a NAND-type flash memory used as a recording medium in a normal digital camera.

The second wiring 31 is in contact with first penetrating electrodes 29 that penetrate the silicon substrate 13. The semiconductor memory 75 is fixed to the rear surface of the silicon substrate 13 by a die attach film 76.

The semiconductor memory 75 has a pad electrode 75*a* for the memory on an upper surface thereof (on a lower surface of the chip in FIG. 9).

An insulating film layer 35, which is a second insulating film 35, is attached to the rear surface of the silicon substrate 13 including the second wiring 31 and the semiconductor memory 75.

On a front surface of the second insulating film 35, third wiring 36 is formed and an image processing semiconductor chip 77 mounted in a normal digital camera is disposed. In the second insulating film 35, second penetrating electrodes 37, which are in contact with the second wiring 31 and the pad electrode 75*a* for the memory, are formed by a method such as patterning.

The third wiring 36 is in contact with the second penetrating electrodes 37. The image processing semiconductor chip 77 is fixed to the front surface of the second insulating film 35 by a die attach film 76.

The image processing semiconductor chip 77 has a pad electrode 77*a* for the chip on an upper surface thereof (on a lower surface of the chip in FIG. 9).

An insulating film layer, which is a third insulating film 78, is attached to the front surface of the second insulating film 35 including the third wiring 36 and the image processing semiconductor chip 77.

On a front surface of the third insulating film 78, fourth wiring 79 is formed and a wireless device semiconductor chip 80 for wirelessly operating the shutter unit 71 from outside and a small battery 81 having a charging function are disposed.

A small capacity battery which is a sheet-type battery and can be charged from outside is suited to the small battery 81 having a charging function.

When a small sheet-type battery 81 having a charging function is applied, regarding a mounting position of the small battery 81 having a charging function, the small battery 81 is not necessarily has to be laminated on the rear surface of the silicon substrate 13, but may be attached to, for example, an outer circumferential surface of the lens holder 11. In this case, wiring which is connected to the small battery 81 having a charging function and which is extended to the lower end surface of the lens holder 11 is provided on the outer circumferential surface of the lens holder 11, and the wiring at the lower end surface of the lens holder 11 is connected to sixth wiring 87 described later by silver paste, so that the small battery 81 is electrically connected to the external electrodes 38.

In the third insulating film 78, third penetrating electrodes 82, which are in contact with the third wiring 36 and the pad electrode 77*a* for the chip, are formed by a method such as patterning.

The fourth wiring 79 is in contact with the third penetrating electrodes 82. The wireless device semiconductor chip 80 and the small battery 81 having a charging function are respectively fixed to a front surface of the third insulating film 78 by a die attach film 76.

The wireless device semiconductor chip 80 has a pad electrode 80*a* for the chip on an upper surface thereof (on a lower surface of the chip in FIG. 9). The small battery 81 having a charging function has a pad electrode 81*a* for the battery on an upper surface thereof (on a lower surface of the chip in FIG. 9).

An insulating film layer, which is a fourth insulating film 83, is attached to the front surface of the third insulating film 78 including the fourth wiring 79, the wireless device semiconductor chip 80, and the small battery 81 having a charging function.

On a front surface of the fourth insulating film 83, fifth wiring 84 is formed and a driving-device driver IC 33 and a shutter unit driver IC 74 for driving the shutter unit 71 are disposed. Fourth penetrating electrodes 85, which are in contact with the fourth wiring 79, the pad electrode 80*a* for the chip, and the pad electrode 81*a* for the battery, are formed on the fourth insulating film 83 by a method such as patterning.

The fifth wiring 84 is in contact with the fourth penetrating electrodes 85. The driver ICs 33 and 74 are respectively fixed to the front surface of the fourth insulating film 83 by a die attach film 76.

The driver IC 33 has a pad electrode 33*a* on an upper surface thereof (on a lower surface of the chip in FIG. 9). The driver IC 74 has a pad electrode 74*a* on an upper surface thereof (on a lower surface of the chip in FIG. 9).

An insulating film layer, which is a fifth insulating film 86, is attached to the front surface of the fourth insulating film 83 including the fifth wiring 84 and the driver ICs 33 and 74.

Sixth wiring 87 is formed on a front surface of the fifth insulting film 86. In the fifth insulating film 86, fifth penetrating electrodes 88, which are in contact with the fifth wiring 84 and the pad electrodes 33*a* and 74*a*, are formed by a method such as patterning. The sixth wiring 87 is in contact with the fifth penetrating electrodes 88.

The external electrodes 38 are formed on the sixth wiring 87. For example, the external electrodes 38 are formed of solder balls.

The front surface of the fifth insulating film 86 including the sixth wiring 87 is covered with solder resist (not shown in FIG. 9) except for areas of the external electrodes.

When the solid-state image pickup device 72 described above is applied, the fixing plate 17 of the lens holder 11 is formed at a position at which a distance k''' between the lower end surface of the lens holder 11 and the fixing plate 17 is slightly longer than a thickness s'' of the solid-state image pickup device 72 excluding the external electrodes 38.

Next, a wiring structure for electrically connecting the coil 23 of the driving-device 19 with the driving-device driver IC 33 and a wiring structure for electrically connecting the shutter unit 71 with the shutter unit driver IC 74 will be described with reference to FIG. 10.

As shown in FIG. 10, a first groove portion 39 having a concave shape and a second groove portion 89 having a concave shape are formed on the inner surface of the lens holder 11. The first groove portion 39 is formed in the same manner as the first groove portion 39 shown in FIG. 2. On the other hand, the second groove portion 89 is formed to penetrate from a position where the shutter unit 71 is disposed to the lower end surface of the lens holder 11 (FIG. 9).

The driving-device wiring 40 is formed in the first groove portion 39 in the same manner as in the camera module 10 shown in FIGS. 1 and 2. Shutter unit wiring 90 is formed in the second groove portion 89.

One end of the driving-device wiring 40 is connected to the coil 23 in the same manner as in the camera module 10 shown in FIGS. 1 and 2. The other end of the driving-device wiring 40 is connected to a driving-device electrode 41 provided on the lower end surface of the lens holder 11. The driving-device electrode 41 is connected to the sixth wiring 87 provided on a rear surface of the solid-state image pickup device 72 by a connection conductor 42.

On end of the shutter unit wiring 90 is connected to the shutter unit 71. The other end of the shutter unit wiring 90 is connected to a shutter unit electrode 91 provided on the lower end surface of the lens holder 11. The shutter unit electrode 91 is connected to the sixth wiring 87 provided on the rear surface of the solid-state image pickup device 72 by a connection conductor 42.

In this way, the driving-device wiring 40 electrically connects the coil 23 of the driving-device 19 disposed above the transparent substrate 14 with the driver IC 33 disposed below the transparent substrate 14. The shutter unit wiring 90 electrically connects the shutter unit 71 disposed above the transparent substrate 14 with the driver IC 74 disposed below the transparent substrate 14.

A manufacturing method of the camera module 70 is the same as that of the camera module 10 of the first embodiment, so that the description thereof will not be repeated here.

Also in the camera module 70 of the fourth embodiment described above, it is possible to connect the coil 23 and the driver IC 33 to each other without forming a penetrating electrode in the transparent substrate 14, so that it is possible to provide the camera module 70 which has an AF function and which can be easily manufactured.

Also in the camera module 70 of the fourth embodiment, it is not necessary to form a position adjustment mechanism that can adjust the mounting positions of the first and the second lenses 18-1 and 18-2 in the lens holder 11, so that it is possible to provide the camera module 70 which has an AF function and which can be easily manufactured. Further, it is not necessary to form a position adjustment mechanism, so that it is possible to provide the inexpensive camera module 70 having an AF function.

Also in the camera module 70 of the fourth embodiment, the driving-device 19 is disposed above the solid-state image pickup device 72 and the driver IC 33 for driving the driving-device 19 is disposed on the rear surface of the silicon substrate 13 included in the solid-state image pickup device 72. Therefore, it is possible to provide the small-sized camera module 70 having an AF function.

Further, the camera module 70 of the fourth embodiment includes the image processing semiconductor chip 77, the wireless device semiconductor 80, the small battery 81 having a charging function, and a shutter mechanism including the shutter unit 71 and the shutter unit driver IC 74. In this way, in the camera module 70, most of constituent elements of a digital camera are mounted. Therefore, the camera module 70 can be used as a digital camera when supplying power from outside to drive the camera module 70 and inputting a shutter signal. Further, the camera module 70 can be driven as a stand-alone digital camera when the small battery 81 having a charging function with a small capacity is mounted and a shutter signal is wirelessly transmitted and received. Therefore, it is possible to provide a chip-size digital camera.

The chip-size digital camera is a hands-free digital camera, which can be attached to a pair of glasses, a hat, and the like, and which does not need a liquid crystal viewfinder. Specifically, it is possible to record an image which is the same as an image seen by eyes, so that it is not necessary to look through a finder, and a moving image or a still image which is the same as an image seen by naked eyes can be recorded.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the camera modules 10, 50, 60, and 70 of the above embodiments are camera modules having an AF function. However, the present invention may be applied to a camera module which does not have an AF function and which has only a shutter function. Alternatively, the present invention may be applied to a camera module which has an auto-iris function (a function for adjusting an amount of incident light according to variation of the brightness of an image to be captured (hereinafter referred to as an AES function)). The AES function is implemented by providing a shutter for adjusting an amount of incident light in the lens holder, disposing various chips for appropriately operating the shutter on the rear surface of the silicon substrate, and connecting the various chips and the shutter by wiring through a groove portion formed in an inner wall surface of the lens holder.

What is claimed is:

1. A camera module comprising:
a cylindrical lens holder including a lens inside thereof;
a transparent substrate disposed below the lens in the lens holder, the transparent substrate having a circumferential surface which is in contact with an inner surface of the lens holder;
a driving-device disposed above the transparent substrate and moving the lens in a vertical direction in the lens holder;
a substrate disposed below the transparent substrate in the lens holder and having a sensor unit on a front surface thereof and wiring on a rear surface thereof and in which the sensor unit and the wiring are connected with each other by a penetrating electrode;
a driver IC for the driving-device disposed at a rear side of the substrate and driving the driving-device;

a plurality of external electrodes formed on the rear surface of the substrate and electrically connected to the wiring and the driver IC for the driving-device respectively; and a wiring for the driving-device electrically connecting the driving-device with the driver IC for the driving-device, the wiring for the driving-device being provided so as to pass between the circumferential surface of the transparent substrate and the inner surface of the lens holder, wherein the transparent substrate and the substrate form a solid-state image pickup device.

2. The camera module according to claim 1, wherein the lens holder has a first groove portion in an inner surface thereof, and the wiring for the driving-device is formed in the first groove portion.

3. The camera module according to claim 1, wherein the lens holder further includes a fixing plate fixed to an inner surface of the lens holder and being in contact with a front surface of the transparent substrate via an adhesive and a top plate formed at an upper end portion of the lens holder and having an opening portion, and the driving-device is disposed between the top plate and the fixing plate.

4. The camera module according to claim 1, further comprising:

a shutter unit fixed to an inner surface of the lens holder;

a driver IC for the shutter unit disposed at the rear side of the substrate and driving the shutter unit; and a wiring for the shutter unit electrically connecting the shutter unit with the driver IC for the shutter unit, the wiring for the shutter unit being provided so as to pass between the circumferential surface of the transparent substrate and the inner surface of the lens holder.

5. The camera module according to claim 3, wherein the driving-device includes two leaf springs disposed separately from each other in the vertical direction and respectively fixed to the inner surface of the lens holder, a cylindrical lens barrel disposed between these leaf springs and holding the lens inside thereof and having a support plate on an outer circumferential surface thereof, a squared U-shaped yoke fixed to the inner surface of the lens holder and generating a magnetic field inside thereof, and a coil disposed inside the yoke and fixed to the support plate of the lens barrel, the wiring for the driving-device electrically connects the driver IC for the driving-device with the coil, and, the driver IC for the driving-device is an IC for flowing a current through the coil.

6. The camera module according to claim 4, wherein the lens holder has a second groove portion in the inner surface thereof, and the wiring for the shutter unit is formed in the second groove portion.

7. The camera module according to claim 5, wherein the substrate includes wiring connected to the driver IC for the driving-device on the rear surface thereof, the lens holder includes an electrode for the driving-device connected to the wiring for the driving-device on a lower end surface thereof, and the driver IC for the driving-device and the coil are electrically connected with each other via the wiring for the driving-device, the wiring connected to the driver IC for the driving-device, and the electrode for the driving-device.

8. The camera module according to claim 4, wherein the lens holder further includes a top plate formed at an upper end portion of the lens holder and having an opening portion, and a shutter unit disposed between the top plate and the driving-device in the lens holder.

9. The camera module according to claim 7, wherein the wiring connected to the driver IC for the driving-device and the electrode for the driving-device are electrically connected with each other by a connection conductor.

10. The camera module according to claim 8, wherein the shutter unit has a shutter blade which opens and closes below the opening portion of the top plate, and the driver IC for the shutter unit is an IC for opening and closing the shutter blade.

11. The camera module according to claim 10, wherein the substrate includes wiring connected to the driver IC for the shutter unit on the rear surface thereof, the lens holder includes an electrode for the shutter unit connected to the wiring for the shutter unit on a lower end surface thereof, and the driver IC for the shutter unit and the shutter unit are electrically connected with each other via the wiring for the shutter unit, the wiring connected to the driver IC for the shutter unit, and the electrode for the shutter unit.

12. The camera module according to claim 11, wherein the wiring connected to the driver IC for the shutter unit and the electrode for the shutter unit are electrically connected with each other by a connection conductor.

13. A method for manufacturing a camera module, the method comprising:

forming an adhesive on a front surface of a transparent substrate of a solid-state image pickup device including a substrate which includes a sensor unit on a front surface thereof and a driver IC for a driving-device disposed at a rear side thereof and the transparent substrate disposed above the substrate;

disposing a cylindrical lens holder which includes a lens and the driving-device that moves the lens in a vertical direction and in which a fixing plate and a wiring for the driving-device that electrically connects the driving-device with the driver IC for the driving-device are provided on an inner surface thereof so that the fixing plated is in contact with the adhesive;

adjusting a position of the lens holder by pressing the fixing plate into the adhesive so that a focal point of the lens corresponds to the sensor unit of the solid-state image pickup device;

curing the adhesive after adjusting the position of the lens holder; and electrically connecting the driving-device with the driver IC for the driving-device via the wiring for the driving-device, wherein the position of the lens holder is adjusted by disposing the lens holder so that a focal point of the lens corresponds to a sensor unit of a test solid-state image pickup device, the test solid-state image pickup device including a substrate having the sensor unit on a front surface thereof and a transparent substrate disposed above the substrate, measuring a distance between a lower end surface of the lens holder and a reference surface of the test solid-state image pickup device if the focal point of the lens corresponds to the sensor unit of the test solid-state image pickup device, measuring a distance between a reference surface of the solid-state image pickup device and the front surface of the transparent substrate of the solid-state image pickup device, and disposing the lens holder at a desired position based on the distance between the lower end surface of the lens holder and the reference surface of the test solid-state image pickup device and a distance between the lower end surface of the lens holder and a reference surface of the solid-state image pickup device.

14. The method for manufacturing a camera module according to claim 13, wherein, the reference surface of the solid-state image pickup device and the reference surface of the test solid-state image pickup device are respectively surfaces of insulating films formed on front surfaces of each substrate.

15. The method for manufacturing a camera module according to claim 13, wherein, the desired position of the lens holder is a position at which a distance between the lower end surface of the lens holder and the front surface of the transparent substrate of the solid-state image pickup device corresponds to a sum of the distance between the lower end surface of the lens holder and the reference surface of the test solid-state image pickup device and the distance between the front surface of the transparent substrate of the solid-state image pickup device and the surface of the solid-state image pickup device.

16. The method for manufacturing a camera module according to claim 13, wherein the lens holder has a first groove portion in an inner surface thereof, the wiring for the driving-device is formed in the first groove portion, and the driving-device is electrically connected with the driver IC for the driving-device by the wiring for the driving-device formed in the first groove portion.

17. The method for manufacturing a camera module according to claim 13, wherein the lens holder includes an electrode for the driving-device connected to the wiring for the driving-device on a lower end surface thereof, and the driving-device is electrically connected with the driver IC for the driving-device by the wiring for the driving-device and the electrode for the driving-device.

18. The method for manufacturing a camera module according to claim 17, wherein the substrate includes wiring connected to the driver IC for the driving-device on the rear surface thereof, and the driving-device is electrically connected with the driver IC for the driving-device by connecting the electrode for the driving-device with the wiring connected to the driver IC for the driving-device by a connection conductor.

* * * * *